US011107708B2

(12) United States Patent
Peng et al.

(10) Patent No.: US 11,107,708 B2
(45) Date of Patent: Aug. 31, 2021

(54) HEATING PLATFORM, THERMAL TREATMENT AND MANUFACTURING METHOD

(71) Applicant: Taiwan Semiconductor Manufacturing Co., Ltd., Hsinchu (TW)

(72) Inventors: Hsiao-Hua Peng, Hsinchu County (TW); Hann-Ru Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 458 days.

(21) Appl. No.: 15/866,479

(22) Filed: Jan. 10, 2018

(65) Prior Publication Data
US 2019/0148185 A1    May 16, 2019

Related U.S. Application Data

(60) Provisional application No. 62/585,537, filed on Nov. 14, 2017.

(51) Int. Cl.
*H01L 21/67* (2006.01)
*G05D 23/19* (2006.01)
(Continued)

(52) U.S. Cl.
CPC ... *H01L 21/67098* (2013.01); *G05D 23/1917* (2013.01); *H01L 21/0226* (2013.01);
(Continued)

(58) Field of Classification Search
CPC .......... H01L 21/67098; H01L 21/0226; H01L 21/67069; H01L 21/67075;
(Continued)

(56) References Cited

U.S. PATENT DOCUMENTS 8,041,197 B2 * 10/2011 Kasai ................. H01L 21/2686
                                                     392/407
8,623,173 B2 *  1/2014 Son ................... H01L 21/67109
                                                     118/724
(Continued)

FOREIGN PATENT DOCUMENTS

JP    2006511963    4/2006
JP    2009031117    2/2009
(Continued)

OTHER PUBLICATIONS

"Office Action of Taiwan Counterpart Application," dated Sep. 14, 2018, pp. 1-5.
(Continued)

*Primary Examiner* — Vishal Pancholi
*Assistant Examiner* — Robert K Nichols, II
(74) *Attorney, Agent, or Firm* — JCIPRNET

(57) ABSTRACT

A heating platform for heating a wafer is provided. The heating platform includes a support carrier, a detection module and a first heating module. The wafer is supported by the support carrier. The detection module is configured to monitor a surface condition of the wafer supported by the support carrier. The first heating module is disposed at a side of the support carrier. The first heating module includes a plurality of heating units electrically connected to the detection module, and the heating units is arranged in an array. A thermal treatment and a manufacturing method are further provided.

19 Claims, 8 Drawing Sheets

(51) Int. Cl.
    *H01L 21/02*     (2006.01)
    *H05B 3/00*      (2006.01)
(52) U.S. Cl.
    CPC .. *H01L 21/67069* (2013.01); *H01L 21/67075*
          (2013.01); *H01L 21/67103* (2013.01); *H01L
                    21/67109* (2013.01); *H01L 21/67115*
          (2013.01); *H01L 21/67248* (2013.01); *H01L
                    21/67253* (2013.01); *H05B 3/0047* (2013.01)
(58) Field of Classification Search
    CPC ......... H01L 21/67103; H01L 21/67109; H01L
                 21/67115; H01L 21/67248; H01L
                 21/67253; H01L 21/67259; H01L
                 21/67288; H05B 3/0047
    USPC ................................ 219/444.1, 390; 392/418
    See application file for complete search history.

(56)              References Cited

U.S. PATENT DOCUMENTS

| 2005/0211694 | A1 | 9/2005 | Moroz |
| 2006/0228897 | A1* | 10/2006 | Timans ............. H01L 21/67115 438/758 |
| 2008/0187299 | A1 | 8/2008 | Shimizu et al. |
| 2008/0226272 | A1 | 9/2008 | Kasai et al. |
| 2011/0033175 | A1 | 2/2011 | Kasai et al. |
| 2015/0170934 | A1* | 6/2015 | Aderhold ................ H01L 22/12 438/7 |
| 2017/0108787 | A1 | 4/2017 | Chang |
| 2017/0221730 | A1 | 8/2017 | Jung, II et al. |

FOREIGN PATENT DOCUMENTS

| KR | 19980022560 | 7/1998 |
| KR | 20080047415 | 5/2008 |
| KR | 20140129126 | 11/2014 |
| KR | 20150102685 | 9/2015 |
| KR | 101593833 | 2/2016 |
| WO | 2016056748 | 4/2016 |

OTHER PUBLICATIONS

"Office Action of Germany Counterpart Application", dated Nov. 12, 2020, p. 1-p. 13.

"Office Action of Korea Counterpart Application", dated Jan. 21, 2021, p. 1-p. 5.

"Office Action of Korea Counterpart Application", dated Jun. 2, 2020, p. 1-p. 7.

"Office Action of Korea Counterpart Application", dated Mar. 25, 2021, p. 1-p. 7.

"Office Action of Korea Counterpart Application", dated Jun. 23, 2021, p. 1-p. 6.

* cited by examiner

HEATING PLATFORM, THERMAL TREATMENT AND MANUFACTURING METHOD

CROSS-REFERENCE TO RELATED APPLICATION

This application claims the priority benefit of U.S. provisional application Ser. No. 62/585,537, filed on Nov. 14, 2017. The entirety of the above-mentioned patent application is hereby incorporated by reference herein and made a part of this specification.

BACKGROUND

Manufacturing processes of the wafer may include a chemical vapor deposition (CVD) process, an etching process, and a chemical-mechanical polishing (CMP) process or the like. In the above-mentioned manufacturing processes, temperature significantly affects the process result, and temperature control and temperature adjustment are quite important during the manufacturing process of the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
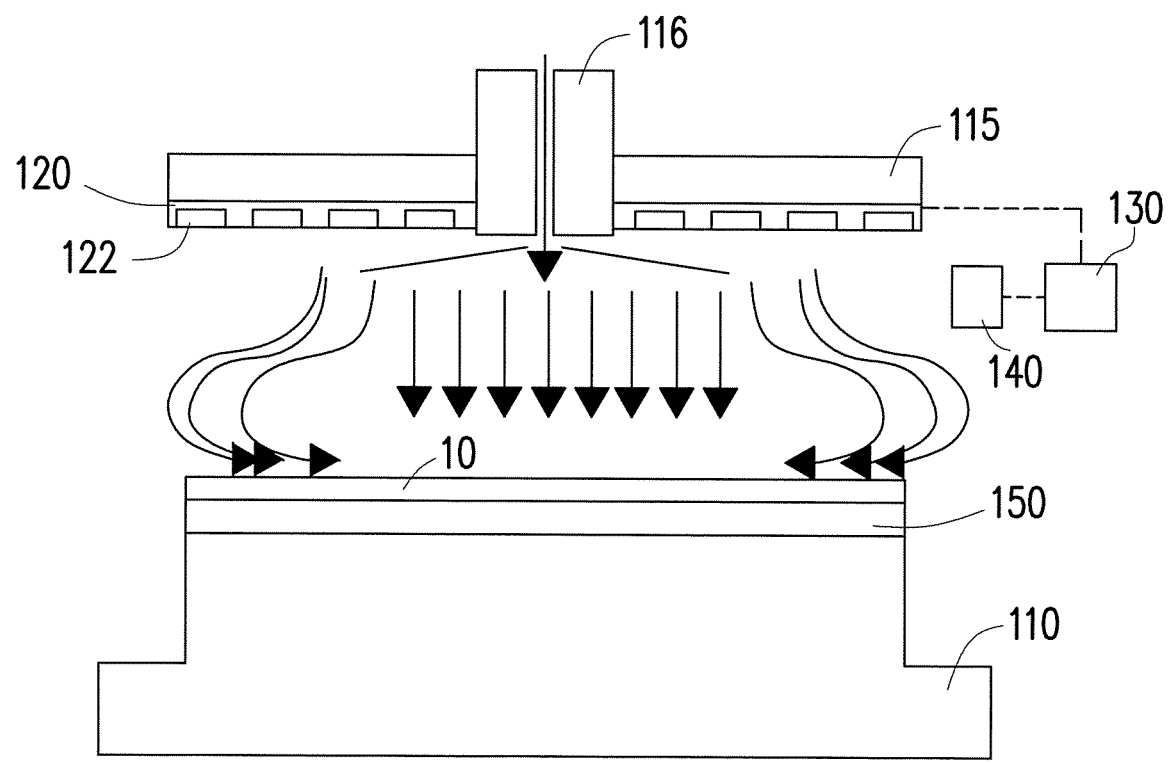
FIG. 1 is a schematic view illustrating a heating platform in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Manufacturing processes of the wafer may include a chemical vapor deposition (CVD) process, an etching process, and a chemical-mechanical polishing (CMP) process or the like. In the above-mentioned manufacturing processes, temperature significantly affects the process result and temperature control and temperature adjustment are quite important during the manufacturing process of the wafer. Taking the CVD process as an example, thickness uniformity of a layer deposited on the wafer is significantly affected by temperature. In addition, in some situations, when a sequentially formed layer is deposited on a layer of the wafer, the thickness uniformity of the layer formed on the wafer may affect the thickness of the sequentially formed layer significantly and may causes low yield rate of the wafer. In order to improve the yield rate of the wafer, heating platforms 100, 100a, 100b, 100c, 100d, and 100e adapted for heating a wafer during the manufacturing process will be introduced in the following description. The heating platforms 100, 100a, 100b, 100c, 100d, and 100e may heat the wafer uniformly or may heat the wafer with specific heat distribution during the manufacturing process.

FIG. 1 is a schematic view illustrating a heating platform in accordance with an embodiment of the present disclosure. Referring FIG. 1, in some embodiments, the heating platform 100 may include a support carrier 110, a detection module, a first heating module 120 and a second heating module 150. The support carrier 110 may be a stage or a base, a wafer 10 may be placed on the support carrier 110 so as to be supported and/or be temporarily fixed. The first heating module 120 is disposed at a side of the support carrier 110. For example, the first heating module 120 is disposed above the support carrier 110. The second heating module 150 may be disposed on the support carrier 110 and the wafer 10 is adapted to be placed on the second heating module 150. That is, in some embodiments, the wafer 10 may be located between the first heating module 120 and the second heating module 150, and the second heating module 150 may be located between the wafer 10 and the support carrier 110. Therefore, in some embodiments, the wafer 10 may be heated by the first heating module 120 which is located above the wafer 10 and the second heating module 150 which is located below the wafer 10. However, the positions of the first heating module 120, the second heating module 150 and the wafer 10 are not limited in the disclosure.

Figure 2:
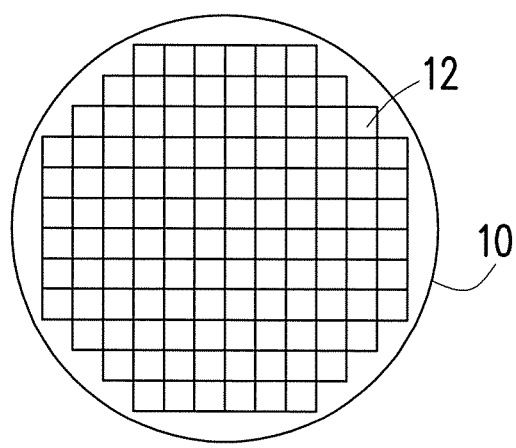
FIG. 2 is a top view illustrating a wafer provided onto the heating platform of FIG. 1 in accordance with an embodiment of the present disclosure.

The detection module is configured to monitor a surface condition of the wafer 10 supported by the support carrier 110. In some embodiments, the detection module may include a detector 140 and a controller 130 electrically connected to the detector 140. FIG. 2 is a top view illustrating a wafer provided onto the heating platform of FIG. 1 in accordance with an embodiment of the present disclosure. Referring FIG. 2, the wafer 10 may include a plurality of die regions 12. In some embodiments, the wafer 10 may be a bare wafer, a wafer having thin films formed thereon or a wafer having a plurality semiconductor dies formed thereon. In each of the die regions 12, there may be one or a plurality of semiconductor dies. In addition, in some embodiments, the surface condition of the wafer 10 may be temperatures of the die regions 12 of the wafer 10. In some alternative embodiments, the surface condition of the wafer 10 may be topography of a top surface of the wafer 10. The type of the surface condition of the wafer 10 is not limited in the disclosure. In other words, in some embodiments, the detection module may detect the temperatures, the topography, or any other suitable surface condition of the die regions 12 of the wafer 10.

Figure 3:
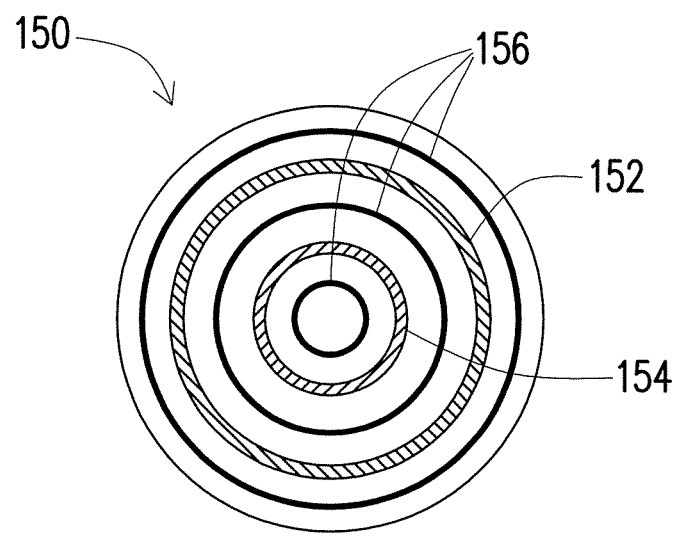
FIG. 3 is a top view illustrating a second heating module of the heating platform of FIG. 1 in accordance with an embodiment of the present disclosure.

FIG. 3 is a top view illustrating a second heating module of the heating platform of FIG. 1 in accordance with an embodiment of the present disclosure. Referring FIG. 3, the second heating module 150 may include at least one main ring-shaped heater and a plurality of subsidiary ring-shaped heaters 156. In some embodiments, the number of the at least one main ring-shaped heater may be two. The number of the at least one main ring-shaped heater is not limited in the disclosure. In addition, as shown in FIG. 3, in some embodiments, the main ring-shaped heaters 152, 154 and the subsidiary ring-shaped heaters 156 may be arranged as concentric circles. However, the arrangement of the main ring-shaped heaters 152, 154 and the subsidiary ring-shaped heaters 156 is not limited in the disclosure.

Moreover, in some embodiments, the main ring-shaped heaters 152, 154 and the subsidiary ring-shaped heaters 156 may be, for example, heating resistors. Temperature output of each of the main ring-shaped heaters 152, 154 may be adjusted, and temperature output of the subsidiary ring-shaped heaters 156 may not be adjusted. In some alternative embodiments, the second heating module 150 may only include a plurality of main ring-shaped heaters 152, 154 whose temperature output may be adjusted, or the second heating module 150 may only include a plurality of subsidiary ring-shaped heaters 156 whose temperature output may not be adjusted. The type of the second heating module 150 is not limited in the disclosure. Furthermore, in some embodiments, the main ring-shaped heaters 152, 154 may be electrically connected to another controller (not shown). In some alternative embodiments, the main ring-shaped heaters 152, 154 may be electrically connected to the above-mentioned detection module.

As shown in FIGS. 2 and 3, because the arrangement of the main ring-shaped heaters 152, 154 and the subsidiary ring-shaped heaters 156 of the second heating module 150 may be different from the arrangement of the die regions 12 of the wafer 10, heat distribution provided by the second heating module 150 to the wafer 10 may be not uniform. In other words, the die regions 12 of the wafer 10 may not be heated uniformly by the second heating module 150. Therefore, in some embodiments, the first heating module 120 of the heating platform 100 may be used so that the wafer 10 may be heated uniformly by the first heating module 120 and the second heating module 150 of the heating platform 100. In some embodiments, heat distribution of the first heating module 120 may be may compensate heat distribution of the second heating module 150 such that the die regions 12 of the wafer 10 may be heated uniformly.

In some alternative embodiments, the first heating module 120 and the second heating module 150 of the heating platform 100 may provide predetermined heat distribution (i.e. non-uniform heat distribution) such that the die regions 12 of the wafer 10 may be heated to different temperature in accordance with actual requirements. For example, when a top surface of the wafer 10 is not flat, the first heating module 120 and the second heating module 150 may provide predetermined heat distribution (i.e. non-uniform heat distribution) and the die regions 12 of the wafer 10 may be heated by the first heating module 120 and the second heating module 150 during the subsequent process (e.g., film deposition process, etch process, polishing process or the like) such that the topography of the top surface of the wafer 10 may be adjusted.

Figure 4A:
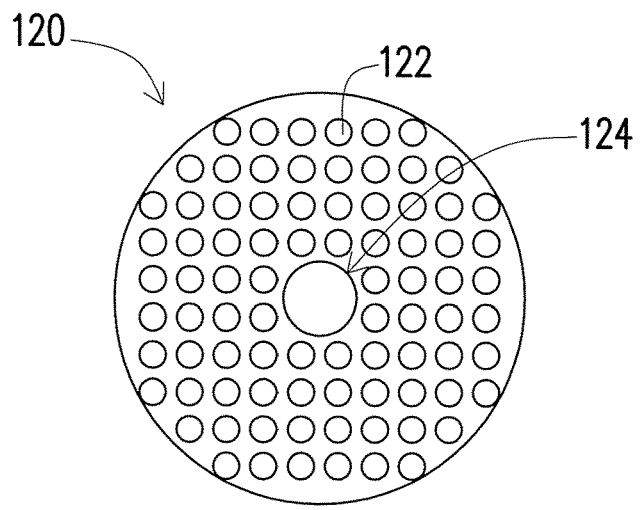
FIG. 4A is a bottom view illustrating a first heating module of the heating platform of FIG. 1 in accordance with an embodiment of the present disclosure.

FIG. 4A is a bottom view illustrating a first heating module of the heating platform of FIG. 1 in accordance with an embodiment of the present disclosure. Referring FIG. 4A, in some embodiments, the first heating module 120 may include a plurality of heating units 122 electrically connected to the detection module. The heating units 122 may be controlled to operate independently such that each of the die regions 12 the wafer 10 may be heated by one of the heating units 122 individually. In some alternative embodiments, each of the heating units 122 may heat at least one of the die regions 12. In some embodiments, each of the heating units 122 may include a UV light source, a microwave source, an IR light source, or a NIR light source. However, the type of the heating units 122 is not limited in the disclosure.

As shown in FIG. 4A, the heating units 122 are arranged in an array. In some embodiments, the array of the heating units 122 may include rows of the heating units 122, and each of the rows of the heating units 122 may include at least two of the heating units 122. For example, the heating units 122 arranged in two adjacent rows among the rows may be substantially aligned along the column direction. In some embodiments, the heating units 122 arranged in all of the rows may be substantially aligned along the column direction. The arrangement of the heating units 122 is not limited in the disclosure. In addition, in some embodiments, the number of the heating units 122 located in each one of the rows may be the same or different. Moreover, in some embodiments, any two adjacent rows of the heating units 122 may be spaced apart by a constant interval. However, in some alternative embodiments, any two adjacent rows of the heating units 122 may be spaced apart by different intervals.

Similarly, in some embodiments, the array of the heating units 122 may include columns of the heating units 122, and each of the columns of the heating units 122 may include at least two of the heating units 122. For example, the heating units 122 arranged in two adjacent columns among the columns are substantially aligned along the row direction. In some embodiments, the heating units 122 arranged in all of the columns may be substantially aligned along the row direction. The arrangement of the heating units 122 is not limited in the disclosure. In addition, in some embodiments, the number of the heating units 122 located in each one of the columns may be the same or different. Moreover, in some embodiments, any two adjacent columns of the heating units 122 may be spaced apart by a constant interval. However, in some alternative embodiments, any two adjacent columns of the heating units 122 may be spaced apart by different intervals.

In some embodiments, the number, the dimensions, and/or the arrangement of the heating units 122 may be the same as the number, the dimensions, and/or the arrangement of the die regions 12 of the wafer 10. In that way, each of the die regions 12 of the wafer 10 may be heated by one of the heating units 122, respectively. Because each of the heating units 122 may provide heat independently, temperatures of the die regions 12 may be controlled and adjusted precisely by the corresponding heating units 122. However, in some embodiments, the number, the dimensions, and/or the arrangement of the heating units 122 may be the different from the number, the dimensions, and/or the arrangement of the die regions 12 of the wafer 10. For example, in some embodiments, the dimension of the heating units 122 may be greater than the dimension of the die regions 12 of the wafer 10, each of the heating units 122 may correspond to a group of die regions 12 adjacent to one another (e.g. four die regions 12 arranged in 2×2 array) of the wafer 10, so the temperature of the group of die regions 12 may be controlled and adjusted by the same heat unit 122.

In some embodiments, the heating platform 100 may be integrated into the process equipment for processing the wafer 10, for example, the CVD chamber, the etching chamber or the CMP equipment. As shown in FIG. 1, the first heating module 120 may be installed to an element 115 (e.g., inner wall) of the process equipment, and an inlet 116 passes through the element 115 and the first heating module 120 so that a fluid (e.g. reactive gas) may be applied into the process equipment through the inlet 116. Accordingly, in FIG. 4A, the first heating module 120 may have a hole 124 used for providing a space for the inlet 116 passing through. In some alternative embodiments, the hole 124 of the first heating module 120 may be omitted.

Figure 4B:
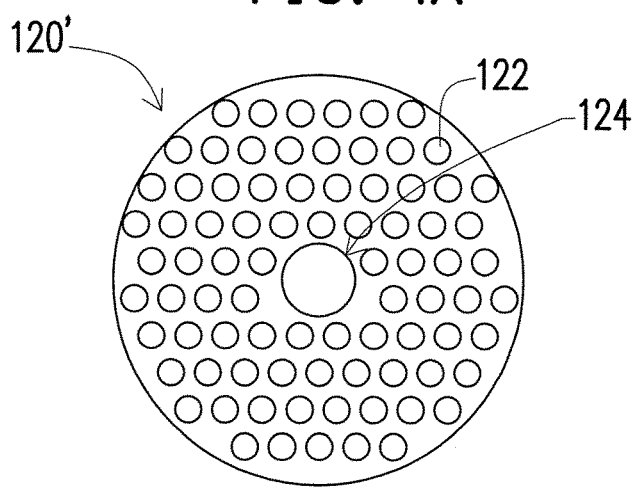
FIG. 4B is a bottom view illustrating a first heating module of the heating platform in accordance with another embodiment of the present disclosure.

FIG. 4B is a bottom view illustrating a first heating module of the heating platform in accordance with another embodiment of the present disclosure. Referring FIG. 4B, the array of the first heating units 122 illustrated in FIG. 4A is similar to the array of the first heating units 122 illustrated in FIG. 4B except that, in the first heating module 120' of FIG. 4B, the heating units 122 arranged in two adjacent rows among the rows are staggered. In addition, in some embodiments, the heating units 122 arranged in odd rows are substantially aligned along the column direction, and the heating units 122 arranged in even rows are substantially aligned along the column direction. In some alternative embodiments, the heating units 122 arranged in odd rows may not be aligned with one another, and the heating units 122 arranged in even rows may not be aligned with one another.

Figure 4C:
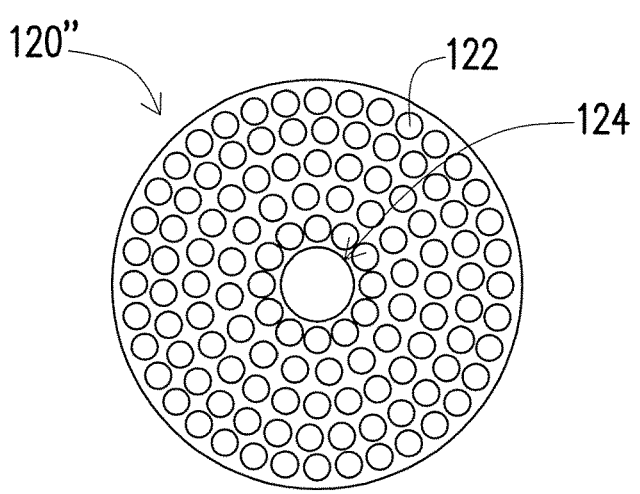
FIG. 4C is a bottom view illustrating a first heating module of the heating platform in accordance with another embodiment of the present disclosure.

FIG. 4C is a bottom view illustrating a first heating module of the heating platform in accordance with another embodiment of the present disclosure. Referring FIG. 4C, in the first heating module 120" of FIG. 4C, the array of the heating units 122 may include groups of the heating units 122, and the groups of the heating units 122 are arranged along a plurality of concentric circular paths, respectively. In FIG. 4C, the number of the groups of the heating units 122 (i.e. the number of the concentric circular paths) is five. However, the number of the groups of the heating units 122 is not limited in the disclosure. In some embodiments, the heating units 122 arranged in each of the concentric circular paths may be controlled and adjusted independently. Therefore, these heating units 122 may flexibly provide heat to the wafer 10 with required heat distribution.

In some embodiments, the hole 124 of the first heating module 120" may be located in the center of the concentric circular paths. In some alternative embodiments, the hole 124 may not be located in the center of the concentric circular paths. Moreover, in some embodiments, the numbers of the heating units 122 arranged in the concentric circular paths are gradually increased along with radiuses of the concentric circular paths. However, the numbers of the heating units 122 arranged in the concentric circular paths are not limited in the disclosure. In addition, in some alternative embodiments, the groups of the heating units 122 may be arranged along a plurality of ellipse paths, respectively. In some alternative embodiments, the groups of heating units 122 may be arranged along a combination of circular paths and ellipse paths. Pattern of each of the groups of the heating units 122 is not limited in the disclosure.

Please back to FIG. 1, the heating units 122 of the first heating module 120 are electrically connected to the controller 130 of the detection module, respectively. The detector 140 of the detection module is adapted to detect or monitor the surface condition of the wafer 10, and then transmits the information of the surface condition to the controller 130. The controller 130 may control the heating units 122 according to the information transmitted by the detector 140, so that the different die regions 12 of the wafer 10 may be heated uniformly by the first heating module 120 and the second heating module 150, or the different die regions 12 of the wafer 10 may be heated with specific heat distribution by the first heating module 120 and the second heating module 150.

In some embodiments, the surface condition may be temperatures of the die regions 12 of the wafer 10. When the wafer 10 is only heated by the second heating module 150, the temperatures of the different die regions 12 of the wafer 10 may not be the same. In other words, the wafer 10 may not be heated uniformly by the second heating module 150, and a top surface of a layer (not shown) formed on the wafer 10 may be not flat after the manufacturing process. In order to improve thickness uniformity of a layer deposited on the wafer 10, the detector 140 may be able to detect the temperatures of the different die regions 12 of the wafer 10. In some embodiments, the detector 140 may be a temperature detector 140 including an IR sensor, a thermocouple or the like. However, the type of the detector 140 is not limited in the disclosure. The location of the detector 140 may be changed due to the type of the detector 140, the location of the detector 140 is not limited in the disclosure.

In some embodiments, the temperature information of the die regions 12 of the wafer 10 detected by the detector 140 may be analyzed by the controller 130, so that the controller 130 may control the heating units 122 of the first heating module 120 to provide heat to the die regions 12 of the wafer 10 with specific heat distribution to compensate the temperature difference between the die regions 12 of the wafer 10. In other words, the die regions 12 of the wafer 10 may be respectively heated by the heating units 122 according to the information detected by the detector 140.

The type of the surface condition of the wafer 10 is not limited in the disclosure. In some alternative embodiments, the surface condition may be topography of a top surface of the wafer 10. In some embodiments, the detector 140 may be an image capturing device including a CCD image sensor, a CMOS image sensor or the like. However, the type of the detector 140 is not limited in the disclosure. In some embodiments, the detector 140 is used for detecting the topography of the top surface of the wafer 10, and the topography information detected by the detector 140 may be analyzed by the controller 130. The controller 130 may control the first heating module 120 to operate according to the topography information detected by the detector 140. The first heating module 120 and the second heating module 150 of the heating platform 100 may provide predetermined heat distribution (i.e. non-uniform heat distribution) such that the die regions 12 of the wafer 10 may be heated to different temperature. For example, when a top surface of the wafer 10 is not flat, the first heating module 120 and the second heating module 150 may provide predetermined heat distribution (i.e. non-uniform heat distribution) and the die regions 12 of the wafer 10 may be respectively heated by the first heating module 120 and the second heating module 150 during the subsequent process (e.g., film deposition process, etch process, polishing process or the like) such that the topography of the top surface of the wafer 10 may be adjusted.

In some embodiments, the heating units 122 of the first heating module 120 may be controlled or adjusted independently, and the heating units 122 of the first heating module 120 may be arranged in an array and/or arranged compactly. Therefore, the first heating module 120 of the heating platform 100 may flexibly provide heat to the wafer 10 with required heat distribution.

Figure 5:
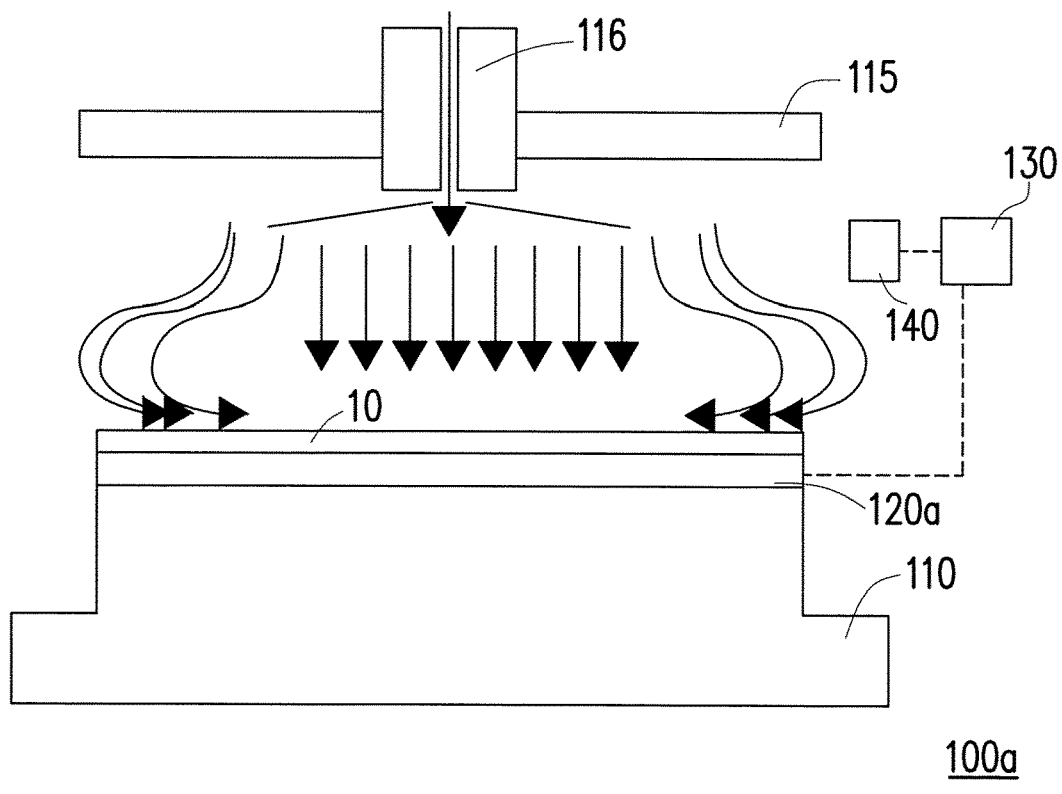
FIG. 5 is a schematic view illustrating a heating platform in accordance with another embodiment of the present disclosure.

FIG. 5 is a schematic view illustrating a heating platform in accordance with another embodiment of the present disclosure. Referring FIG. 5, the heating platform 100a illustrated in FIG. 5 is similar to the heating platform 100 illustrated in FIG. 1 except that, in FIG. 5, a first heating module 120a may be disposed on the support carrier 110, and the first heating module 120a is located between the wafer 10 and the support carrier 110. In addition, the second heating module 150 is omitted in FIG. 5, so that the wafer 10 may only be heated by the first heating module 120a.

Figure 6:
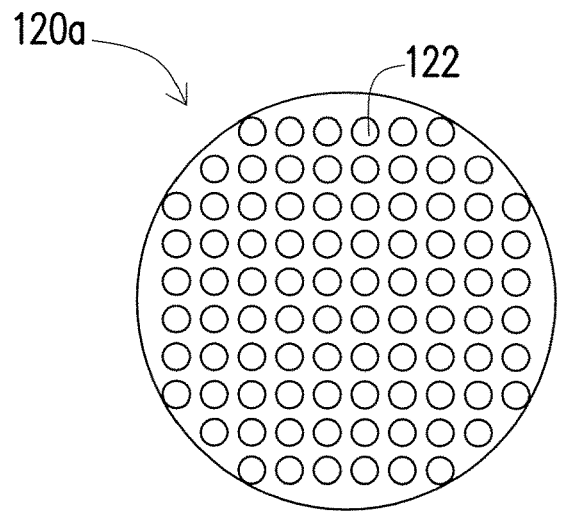
FIG. 6 is a top view illustrating a first heating module of the heating platform of FIG. 5 in accordance with another embodiment of the present disclosure.

FIG. 6 is a top view illustrating a first heating module of the heating platform of FIG. 5 in accordance with another embodiment of the present disclosure. Referring FIGS. 5 and 6, because the first heating module 120a in FIG. 5 is not disposed at a position where the inlet 116 (shown in FIG. 1) is located, the first heating module 120a shown in FIG. 6 does not require to have the hole 124 (shown in FIG. 4A) for the inlet 116. As shown in FIG. 6, portions of the heating units 122 may be arranged in the central part of the first heating module 120a, so that the arrangement of the heating units 122 is much closer to the arrangement of the die region of the wafer 10. Similarly, in the heating platform 100a of FIG. 5, the heating units 122 of the first heating module 120a may be arranged in array and be controlled or adjusted independently, so that heat provided by the heating units 122 may have specific heat distribution.

Figure 7:
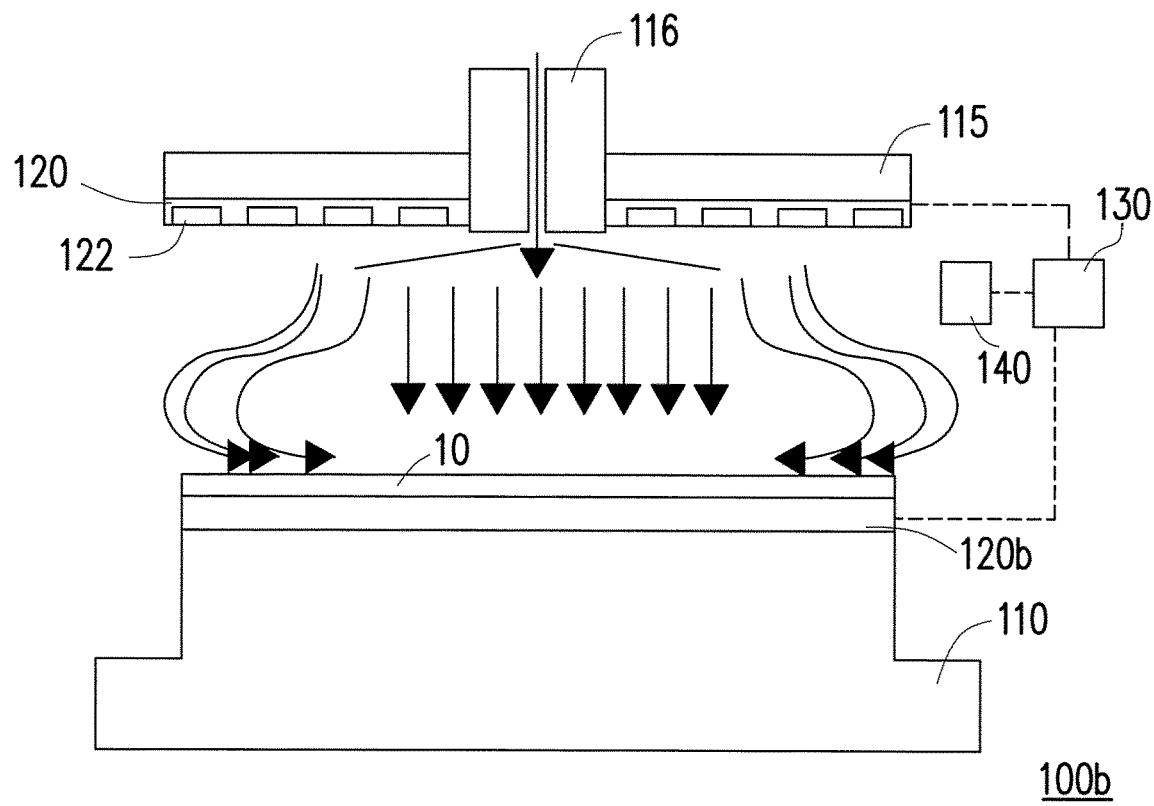
FIG. 7 is a schematic view illustrating a heating platform in accordance with another embodiment of the present disclosure.
Figure 8:
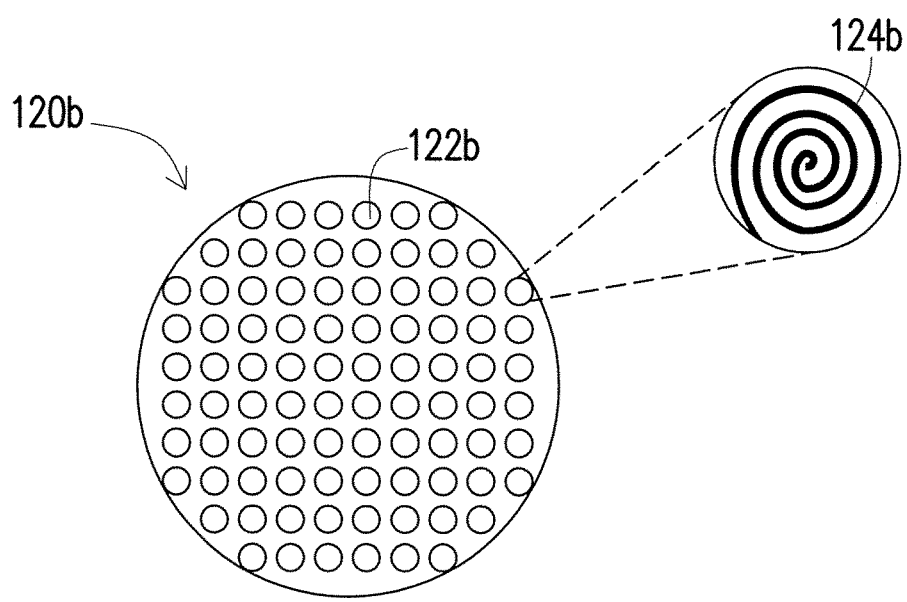
FIG. 8 is a top view illustrating a first heating module of the heating platform of FIG. 7 in accordance with another embodiment of the present disclosure.

FIG. 7 is a schematic view illustrating a heating platform in accordance with another embodiment of the present disclosure. FIG. 8 is a top view illustrating a first heating module of the heating platform of FIG. 7 in accordance with another embodiment of the present disclosure. Referring FIGS. 7 and 8, the heating platform 100b illustrated in FIG. 7 is similar to the heating platform 100 illustrated in FIG. 1 except that that, in FIG. 7, the second heating module 150 in FIG. 1 is substituted by one first heating module 120b. That is, in some embodiments, the heating platform 100b may have two first heating module 120, 120b. One of the first heating module 120 in FIG. 7 is disposed above the wafer 10 as the location of the first heating module 120 in FIG. 1, the other first heating module 120b in FIG. 7 is disposed on the support carrier 110 as the location of the second heating module 150 in FIG. 1. In some embodiments, the wafer 10 is placed between the two first heating modules 120, 120b and heated by the two first heating modules 120, 120b, so that heat with accurate temperature may be provided by the heating platform 100b.

In some embodiments, each of the heating units 122 of the upper first heating module 120 may include a UV light source, a microwave source, an IR light source, or a NIR light source. However, the type of the upper first heating units 122 is not limited in the disclosure. In addition, as shown in FIG. 8, in some embodiments, each of the heating units 122b of the lower first heating module 120b may include a fluid pipe 124b containing heating fluid. The heating fluid may be water, vapor or any suitable fluid with high temperature. The type of the heating fluid is not limited in the disclosure. In some alternative embodiments, the type of the upper first heating module 120 may be the same as the type of the lower first heating module 120b. In other words, both of the two first heating modules 120, 120b may heat the wafer 10 by the UV light source, a microwave source, an IR light source, or a NIR light source. Or both of the two first heating modules 120, 120b may heat the wafer 10 by the fluid pipe 124b containing heating fluid. In some alternative embodiments, both of the two first heating modules 120, 120b may heat the wafer 10 by the heating resistors. In addition, in some embodiments, each of the first heating modules 120, 120b may only have one kind of the heating units 122, 122b. However, in some alternative embodiments, each of the first heating modules 120, 120b may have different kinds of the heating units 122, 122b. For example, each of the first heating modules 120, 120b may have at least two of a UV light source, a microwave source, an IR light source, a NIR light source, the heating resistors and the fluid pipe 124b containing heating fluid.

Figure 9:
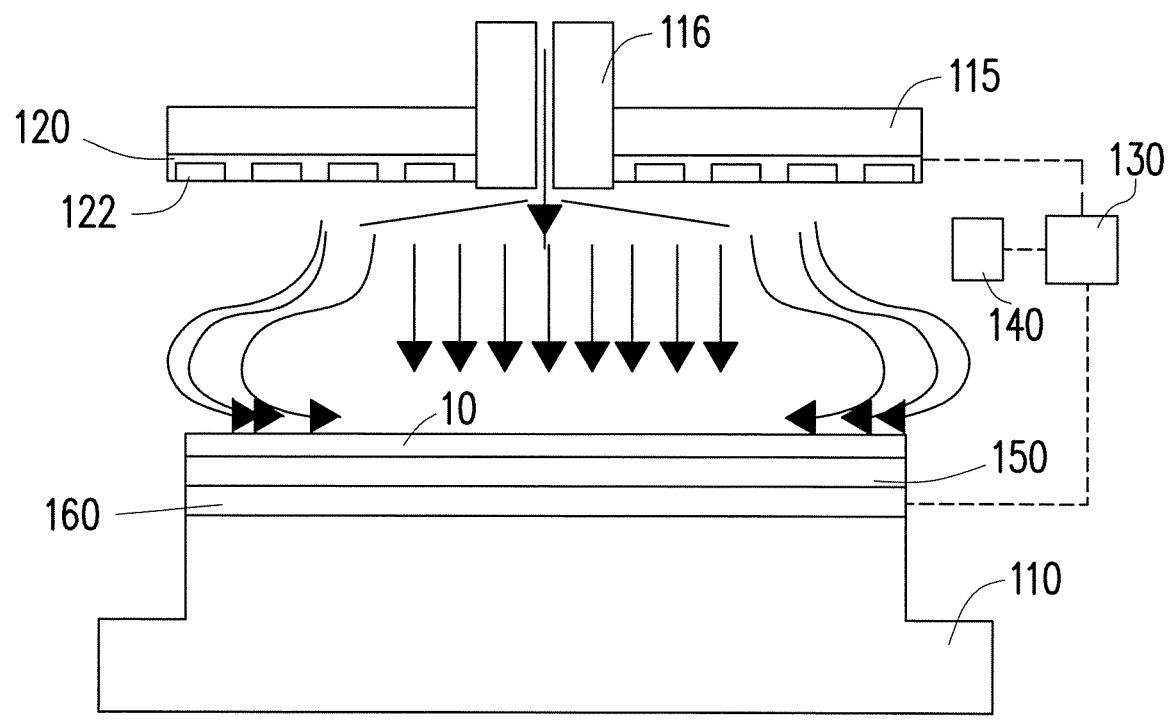
FIG. 9 is a schematic view illustrating a heating platform in accordance with another embodiment of the present disclosure.
Figure 10:
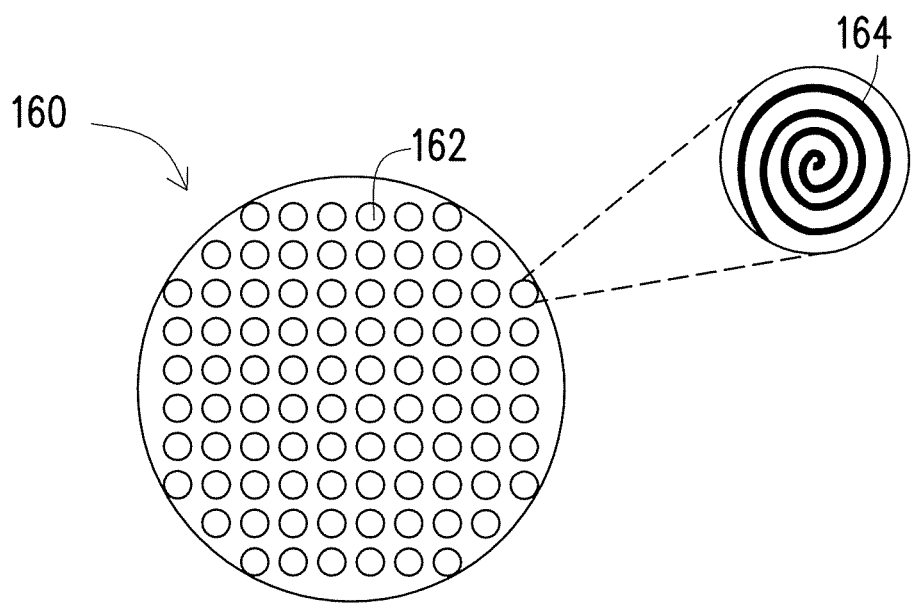
FIG. 10 is a top view illustrating a cooling module of the heating platform of FIG. 9 in accordance with an embodiment of the present disclosure.

FIG. 9 is a schematic view illustrating a heating platform in accordance with another embodiment of the present disclosure. FIG. 10 is a top view illustrating a cooling module of the heating platform of FIG. 9 in accordance with an embodiment of the present disclosure. Referring FIGS. 9 and 10, the heating platform 100c illustrated in FIG. 9 is similar to the heating platform 100 illustrated in FIG. 1 except that, in FIG. 9, the heating platform 100c may further include a cooling module 160. In some embodiments, the cooling module 160 is disposed on the support carrier 110, the cooling module 160 is disposed between the support carrier 110 and the second heating module 150, and the second heating module 150 is disposed between the cooling module 160 and the wafer 10. However, the location of the cooling module 160 is not limited in the disclosure.

In some embodiments, the cooling module 160 includes a plurality of cooling units 162 electrically connected to the detection module, respectively. The cooling units 162 may be operated by the controller 130 of the detection module. As shown in FIG. 10, in some embodiments, each of the cooling units 162 may include a fluid pipe 164 containing cooling fluid. The cooling fluid may be water, refrigerant or any suitable fluid with low temperature. However, the types of the cooling units 162 and the cooling fluid are not limited in the disclosure. The cooling units 162 may be operated during the manufacturing process for lower the temperate of the wafer 10, and/or the cooling unit may be operated after the manufacturing process so as to cool down the heated wafer 10. In addition, the cooling units 162 may be arranged in an array. In some embodiments, because the cooling units 162 may be arranged in an array and may be controlled and adjusted independently, these cooling units 162 may dissipate heat from the different die regions 12 of the wafer 10 effectively.

The array of the cooling units 162 may include rows of cooling units 162, and each of the rows of the cooling units 162 includes portions of the cooling units 162. In some embodiments, the cooling units 162 arranged in two adjacent rows among the rows are substantially aligned along the column direction. In some embodiments, the cooling units 162 arranged in all of the rows may be substantially aligned along the column direction. The arrangement of the cooling units 162 arranged in two adjacent rows among the rows is not limited in the disclosure.

Of course, the type of the array of the cooling units 162 is not limited in the disclosure. In some alternative embodiments, the cooling units 162 arranged in two adjacent rows among the rows are staggered. Moreover, in some embodiments, the numbers of the cooling units 162 located in each one of the rows may be the same or different. In addition, in some embodiments, any two adjacent rows of the cooling units 162 may be spaced apart by a constant interval. However, in some alternative embodiments, any two adjacent rows of the cooling units 162 may be spaced apart by different intervals. Furthermore, in some alternative embodiments, the array of the cooling units 162 may include groups of the cooling units 162, and the groups of the cooling units 162 are arranged along a plurality of concentric circular paths, respectively. The pattern of the array of the cooling units 162 is not limited in the disclosure.

In some embodiments, the number, the dimension, and/or the arrangement of the cooling units 162 may be the same as the number, the dimension, and/or the arrangement of the array of the die regions 12 of the wafer 10. In that way, the die regions 12 of the wafer 10 may be cooled down by the corresponding cooling units 162, respectively. However, in some embodiments, the number, the dimension, and/or the arrangement of the cooling units 162 may be the different from the number, the dimension, and/or the arrangement of the die regions 12 of the wafer 10. For example, in some embodiments, the dimension of the cooling unit may be greater than the dimension of the die region of the wafer 10, each of the cooling units 162 may correspond a group of die regions 12 adjacent to one another (e.g. four die regions 12 arranged in 2×2 array) of the wafer 10, so the temperature of the group of die regions 12 may be controlled and adjusted by the same cooling units 162.

Figure 11:
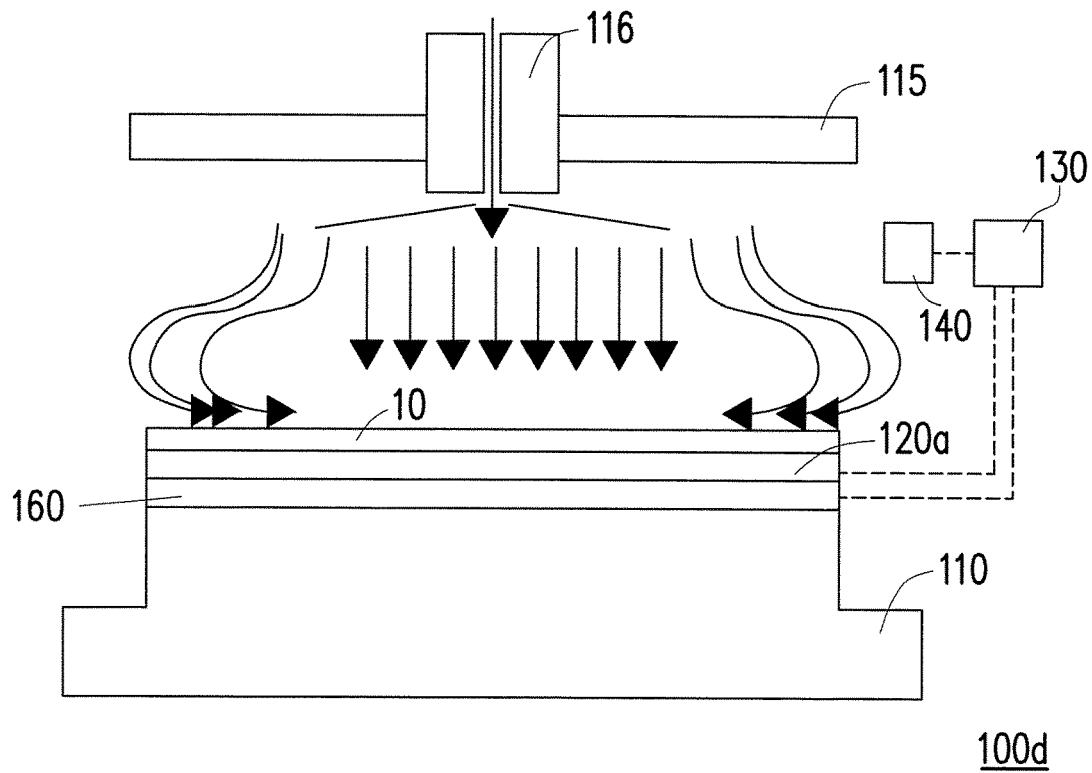
FIG. 11 is a schematic view illustrating a heating platform in accordance with another embodiment of the present disclosure.
Figure 12:
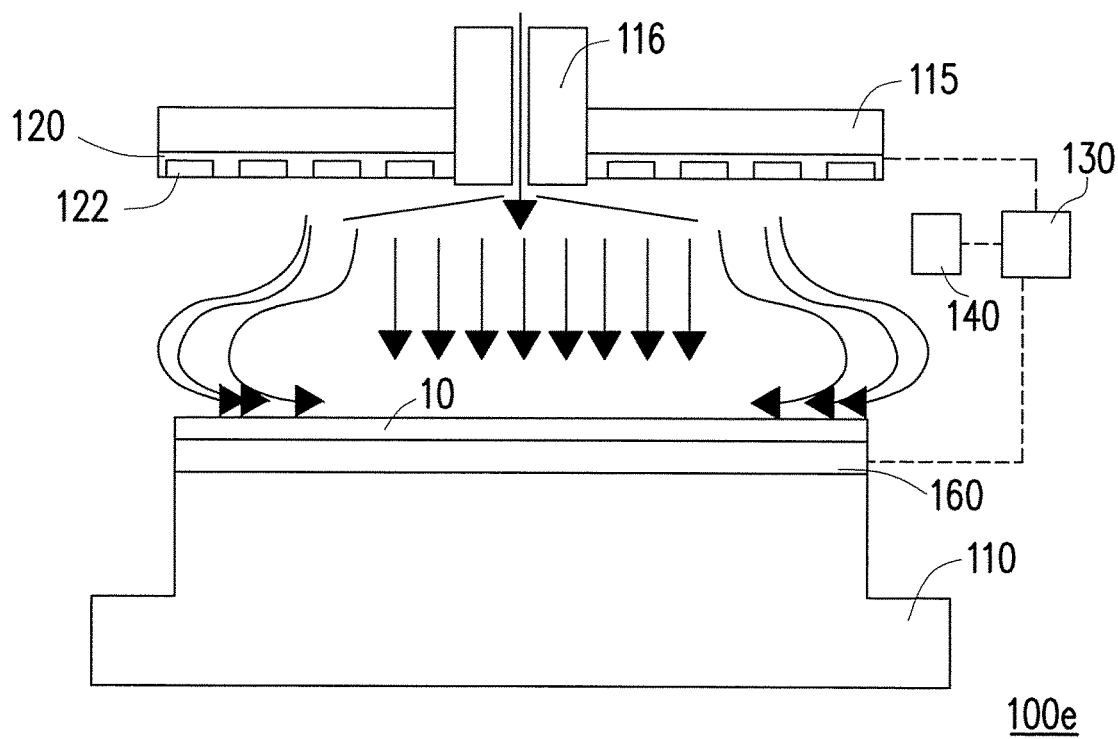
FIG. 12 is a schematic view illustrating a heating platform in accordance with another embodiment of the present disclosure.

FIG. 11 is a schematic view illustrating a heating platform in accordance with another embodiment of the present disclosure. Referring FIG. 11, the heating platform 100d of FIG. 11 may include the heating platform 100a of FIG. 5 and the cooling module 160. FIG. 12 is a schematic view illustrating a heating platform in accordance with another embodiment of the present disclosure. Referring FIG. 12, the heating platform 100e of FIG. 12 may include the heating platform 100b of FIG. 7 and the cooling module 160. As shown in FIGS. 9, 11 and 12, the heating platforms 100c, 100d, and 100e not only have the first heating module 120 or 120a but also have the cooling module 160. The heating units 122 of the first heating module 120 or 120a may be independently operated so as to provide heat to the die regions 12 of the wafer 10 with specific heat distribution. Similarly, the cooling units 162 of the cooling module 160 may be independently operated so as to dissipate heat from the different die regions 12 of the wafer 10. Due to the design of the heating platforms 100, 100a, 100b, 100c, 100d and 100e, the quality of the wafer 10 may be improved, and the yield rate of the wafer 10 may be improved.

The heating platforms 100, 100a, 100b, 100c, 100d and 100e mention above may be applied to the process equipment for processing the wafer 10, for example, the CVD chamber, the etching chamber or the CMP equipment. A manufacturing method for the wafer 10 will be mentioned in the following descriptions.

Figure 13:
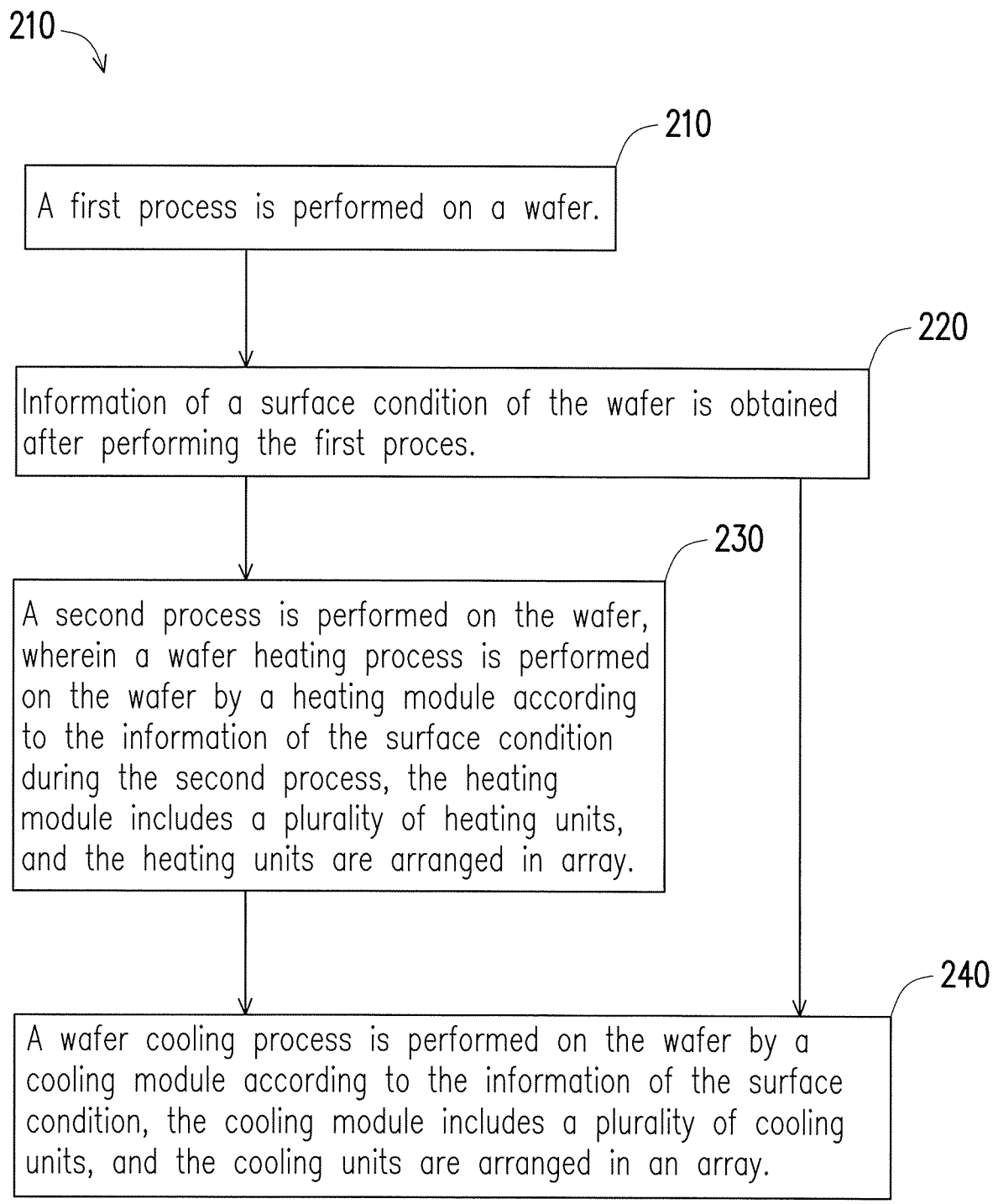
FIG. 13 is a flow chart illustrating a manufacturing method in accordance with an embodiment of the present disclosure.

FIG. 13 is a flow chart illustrating a manufacturing method in accordance with an embodiment of the present disclosure. Referring FIG. 13, the manufacturing method 200 may include the following steps. Firstly, in step 210, a first process is performed on a wafer 10. In some embodiments, the first process may include a chemical vapor deposition (CVD) process, a physical vapor deposition (PVD) process, a dry etching process, a wet etching process or a chemical-mechanical polishing (CMP) process. However, the type of the first process is not limited in the disclosure. After performing the first process, a layer (not shown) may be formed on the wafer 10, or a part of a layer (not shown) may be removed from the wafer 10.

Then, in step 220, information of a surface condition of the wafer 10 is obtained after performing the first process. In some embodiments, the surface condition may be topography of a top surface of the wafer 10. In some alternative embodiments, the surface condition may be temperatures of a plurality of regions of a top surface of the wafer 10. The type of the surface condition is not limited in the disclosure.

Later, in step 230, a second process is performed on the wafer 10, wherein a wafer heating process is performed on the wafer 10 by a heating module according to the information of the surface condition during the second process, the heating module includes a plurality of heating units 122, and the heating units 122 are arranged in array.

In some embodiments, the second process may include a chemical vapor deposition (CVD) process, a physical vapor deposition (PVD) process, a dry etching process, a wet etching process or a chemical-mechanical polishing (CMP) process. However, the type of the second process is not limited in the disclosure. In the step 230, the heating units 122 of the heating module may operate independently and provide heat with different temperature to the die regions 12 the wafer 10 according to the information of the surface condition.

In some embodiments, the first heating module 120 may be used for providing heat to the die regions 12 of the wafer 10 uniformly. In some alternative embodiments, the first heating module 120 may provide predetermined heat distribution (i.e. non-uniform heat distribution) such that the die regions 12 of the wafer 10 may be heated to different temperature in accordance with actual requirements.

In some embodiments, each of the heating units 122 may include a UV light source, a microwave source, an IR light source, or a NIR light source. In some alternative embodiments, each of the heating units 122 may include a heating resistor. In some alternative embodiments, each of the heating units 122 may include a fluid pipe 124b containing heating fluid. The heating fluid may be water, vapor or any suitable fluid with high temperature. However, the type of the heating units 122 is not limited in the disclosure. In addition, in some embodiments, the type of the heating units 122 may be the same. However, in some alternative embodiments, the types of the heating units 122 may be different. For example, the heating units 122 may include at least two of a UV light source, a microwave source, an IR light source, a NIR light source, the heating resistors and the fluid pipe 124b containing heating fluid.

In addition, in step 240 of the manufacturing method 200, a wafer cooling process is performed on the wafer 10 by a cooling module 160 according to the information of the surface condition, the cooling module 160 includes a plurality of cooling units 162, and the cooling units 162 are arranged in an array. In some embodiments, each of the cooling units 162 may include a fluid pipe 164 containing cooling fluid. The cooling fluid may be water, refrigerant or any suitable fluid with low temperature. However, the types of the cooling units 162 and the cooling fluid are not limited in the disclosure.

In some embodiments, the wafer cooling process may be performed after the first process or the second process, so that the cooling units 162 may be used for cooling down the heated wafer 10. In some alternative embodiments, the wafer cooling process may be performed during the first process or the second process. In other words, during the first process or the second process, the wafer 10 may be heated by the heating module and be cooled down by the cooling module 160, a moderate temperature of the wafer 10 may be provided by the heating module and the cooling module 160. In some alternative embodiments, the wafer cooling process may be performed along with a third process. In some embodiments, the third process may include a chemical vapor deposition (CVD) process, a physical vapor deposition (PVD) process, a dry etching process, a wet etching process or a chemical-mechanical polishing (CMP) process. However, the type of the third process is not limited in the disclosure. Moreover, in some embodiments, the step 240 may be omitted. That is, the step 240 is optional.

By applying the manufacturing method 200, in some embodiments, during the manufacturing process of the wafer 10, heat may be provided to the different die regions 12 of the wafer 10 uniformly. Accordingly, thicknesses of different regions of a layer formed on the wafer 10 may be similar or the same, and the layer may be formed on the wafer 10 uniformly. In some alternative embodiments, the first heating module 120 may provide predetermined heat distribution (i.e. non-uniform heat distribution) such that the die regions 12 of the wafer 10 may be heated to different temperature in accordance with actual requirements. For example, when a top surface of the wafer 10 is not flat, the first heating module 120 may provide predetermined heat distribution (i.e. non-uniform heat distribution) and the die regions 12 of the wafer 10 may be heated by the first heating module 120 during the subsequent process (e.g., film deposition process, etch process, polishing process or the like) such that the topography of the top surface of the wafer 10 may be adjusted.

In accordance with some embodiments of the disclosure, a heating platform for heating a wafer is provided. The heating platform includes a support carrier, a detection module and a first heating module. The wafer is supported by the support carrier. The detection module is configured to monitor a surface condition of the wafer supported by the support carrier. The first heating module is disposed at a side of the support carrier. The first heating module includes a plurality of heating units electrically connected to the detection module, and the heating units is arranged in an array.

In accordance with some alternative embodiments of the disclosure, a thermal treatment includes the following steps. A wafer is provided onto a heating platform. A surface condition of the wafer is detected by a detection module of the heating platform. A wafer heating process is performed by a heating module of the heating platform according to information detected by the detection module, wherein the heating units comprising a plurality of heating units, and the heating units are arranged in array.

In accordance with some embodiments of the disclosure, a manufacturing method includes the following steps. A first process is performed on a wafer. Information of a surface condition of the wafer is obtained after performing the first process. A second process is performed on the wafer, wherein a wafer heating process is performed on the wafer by a heating module according to the information of the surface condition during the second process, the heating module comprises a plurality of heating units, and the heating units are arranged in array.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A heating platform for heating a wafer, the heating platform comprising:
    a support carrier, the wafer being supported by the support carrier;
    a detection module, configured to monitor a surface condition of the wafer supported by the support carrier, wherein the surface condition comprises topography of a top surface of the wafer; and
    a first heating module disposed at a side of the support carrier, the first heating module comprising a plurality of heating units electrically connected to the detection module, and the heating units being arranged in an array, wherein the first heating module further comprises a hole configured for an inlet of a process equipment to pass through, and the plurality of heating units surrounds the hole.

2. The heating platform according to claim 1, wherein the first heating module is disposed above the support carrier, and the wafer is between the first heating module and the support carrier.

3. The heating platform according to claim 1, further comprising:
    a second heating module disposed on the support carrier, wherein the first heating module is disposed above the second heating module, and the wafer is between the first heating module and the second heating module.

4. The heating platform according to claim 1, wherein the array of the heating units comprises rows of the heating units, and the heating units arranged in two adjacent rows substantially aligned along a column direction.

5. The heating platform according to claim 1, wherein the array of the heating units comprises rows of the heating units, and the heating units arranged in two adjacent rows among the rows are staggered.

6. The heating platform according to claim 1, wherein the array of the heating units comprises groups of the heating units, and the groups of the heating units are arranged along a plurality of concentric circular paths, respectively.

7. The heating platform according to claim 1, wherein each of the heating units comprises a UV light source, a microwave source, an IR light source, or a NIR light source.

8. The heating platform according to claim 1, wherein each of the heating units comprises a fluid pipe containing heating fluid.

9. The heating platform according to claim 1, further comprising:
a cooling module disposed on the support carrier and comprising a plurality of cooling units electrically connected to the detection module, and the cooling units are arranged in an array.

10. The heating platform according to claim 9, wherein each of the cooling units comprises a fluid pipe containing cooling fluid.

11. The heating platform according to claim 1, wherein the array of the cooling units comprises rows of the cooling units, and the cooling units arranged in two adjacent rows substantially aligned along a column direction.

12. A thermal treatment, comprising:
providing a wafer onto a heating platform;
detecting a surface condition of the wafer by a detection module of the heating platform, wherein the surface condition comprises topography of a top surface of the wafer; and
performing a wafer heating process by a heating module of the heating platform according to information detected by the detection module, wherein the heating module comprises a plurality of heating units, and the heating units are arranged in array, wherein two adjacent rows of the array of the heating units are substantially aligned along a column direction.

13. The thermal treatment according to claim 12, wherein a plurality of regions of the top surface of the wafer are respectively heated by the heating units according to the topography of the top surface of the wafer.

14. The thermal treatment according to claim 12, further comprising:
performing a wafer cooling process by a cooling module of the heating platform according to information detected by the detection module, wherein the cooling module comprises a plurality of cooling units, and the cooling units are arranged in array.

15. A manufacturing method, comprising:
performing a first process on a wafer, wherein the first process comprises a chemical vapor deposition (CVD) process, a physical vapor deposition (PVD) process, a dry etching process, a wet etching process or a chemical-mechanical polishing (CMP) process;
obtaining information of a surface condition of the wafer after performing the first process, wherein the surface condition comprises topography of a top surface of the wafer; and
performing a second process on the wafer, wherein a wafer heating process is performed on the wafer by a heating module according to the information of the surface condition during the second process, the heating module comprises a plurality of heating units, and the heating units are arranged in array.

16. The manufacturing method according to claim 15, wherein the second process comprises a chemical vapor deposition (CVD) process, a physical vapor deposition (PVD) process, a dry etching process, a wet etching process or a chemical-mechanical polishing (CMP) process.

17. The manufacturing method according to claim 15, wherein a plurality of regions of the top surface of the wafer are respectively heated by the heating units according to the topography of the top surface of the wafer during the second process.

18. The manufacturing method according to claim 15, further comprising:
performing a wafer cooling process on the wafer by a cooling module according to the information of the surface condition, the cooling module comprises a plurality of cooling units, and the cooling units are arranged in an array.

19. The manufacturing method according to claim 18, wherein the wafer cooling process is performed after the first process or the second process.

* * * * *